(12) United States Patent
Schultz

(10) Patent No.: US 9,704,995 B1
(45) Date of Patent: Jul. 11, 2017

(54) GATE ALL AROUND DEVICE ARCHITECTURE WITH LOCAL OXIDE

(71) Applicant: Advanced Micro Devices, Inc., Sunnyvale, CA (US)

(72) Inventor: Richard T. Schultz, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 15/270,982

(22) Filed: Sep. 20, 2016

(51) Int. Cl.
  *H01L 29/76* (2006.01)
  *H01L 29/78* (2006.01)
  *H01L 29/66* (2006.01)
  *H01L 29/06* (2006.01)
  *H01L 29/165* (2006.01)
  *H01L 29/51* (2006.01)

(52) U.S. Cl.
  CPC ...... *H01L 29/7856* (2013.01); *H01L 29/0673* (2013.01); *H01L 29/165* (2013.01); *H01L 29/517* (2013.01); *H01L 29/66795* (2013.01); *H01L 2029/7858* (2013.01)

(58) Field of Classification Search
  CPC ............. H01L 29/7856; H01L 29/0673; H01L 29/165; H01L 29/517; H01L 29/66795; H01L 2029/7858

USPC ........................................................ 257/410
See application file for complete search history.

(56) References Cited

U.S. PATENT DOCUMENTS 9,425,318 B1 * 8/2016 Hoentschel ......... H01L 29/7851

* cited by examiner

*Primary Examiner* — Tu-Tu Ho
(74) *Attorney, Agent, or Firm* — Rory D. Rankin; Meyertons, Hood, Kivlin, Kowert & Goetzel, P.C.

(57) ABSTRACT

A system and method for fabricating non-planar devices while managing short channel and heating effects are described. A semiconductor device fabrication process includes forming a non-planar device where the body of the device is insulated from the silicon substrate, but the source and drain regions are not insulated from the silicon substrate. The process builds a local silicon on insulator (SOI) while not insulating area around the source and drain regions from the silicon substrate. A trench is etched a length at least that of a channel length of the device while being bounded by a site for a source region and a site for a drain region. The trench is filled with relatively thick layers to form the local SOI. When nanowires of a gate are residing on top of the layer-filled trench, a second trench is etched into the top layer for depositing gate metal in the second trench.

20 Claims, 10 Drawing Sheets

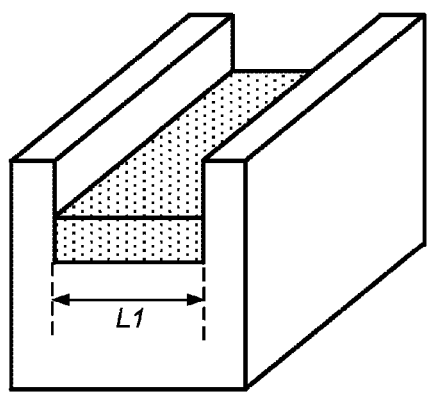
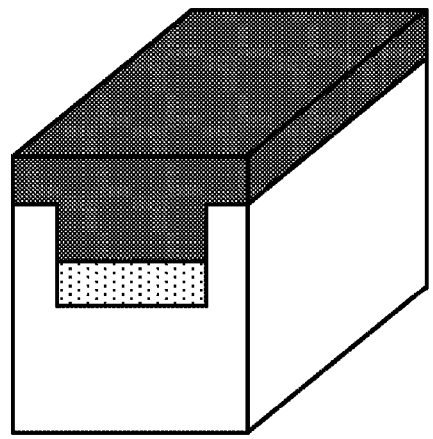
FIG. 1          FIG. 2
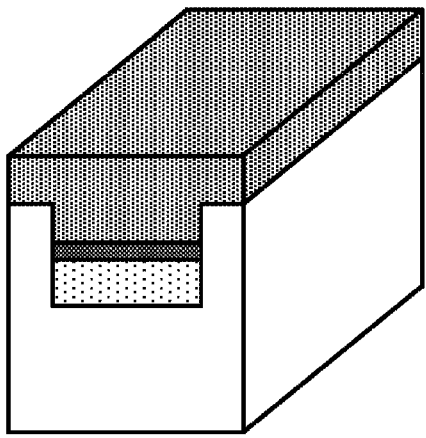
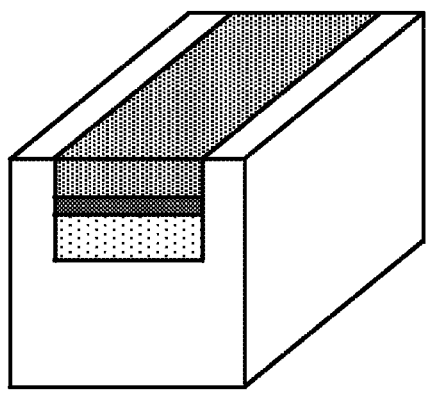
FIG. 3          FIG. 4
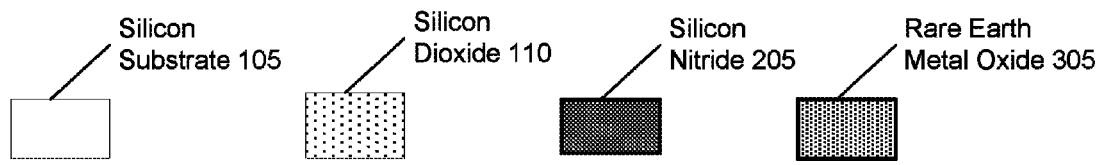

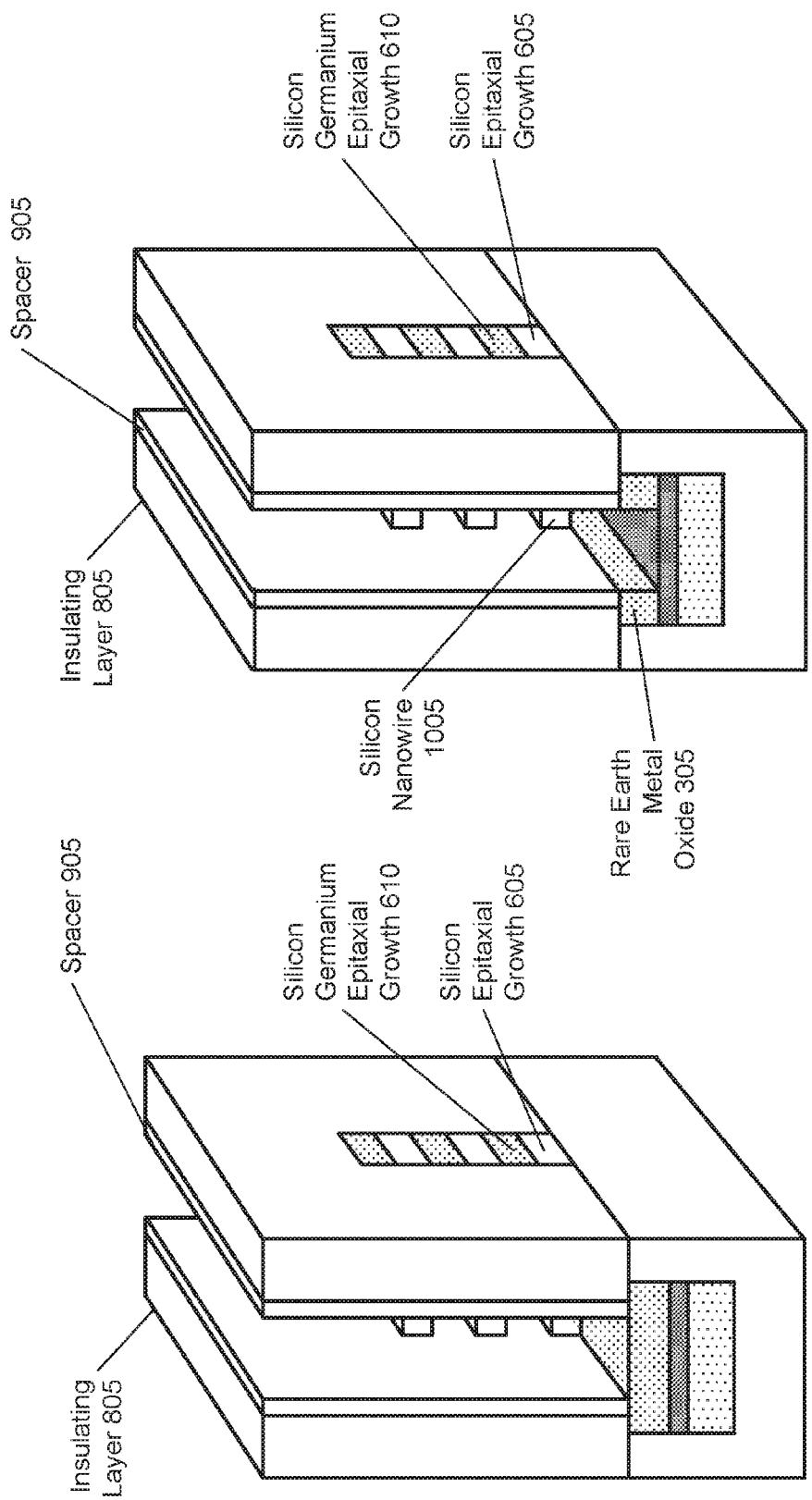

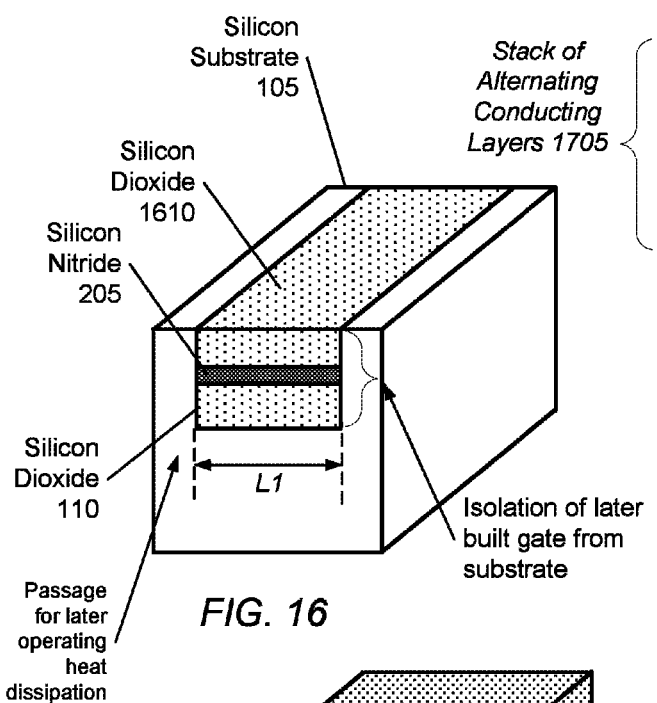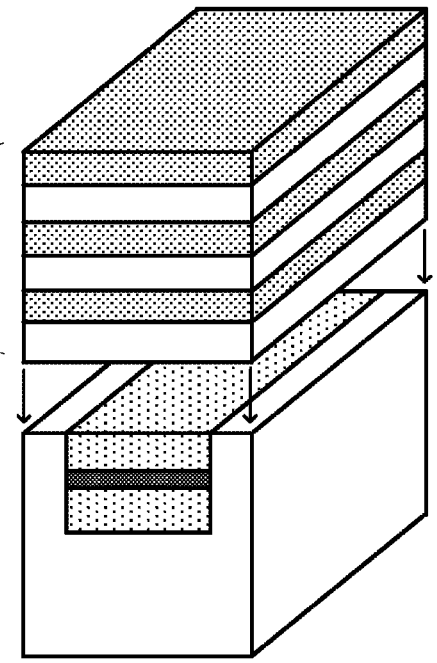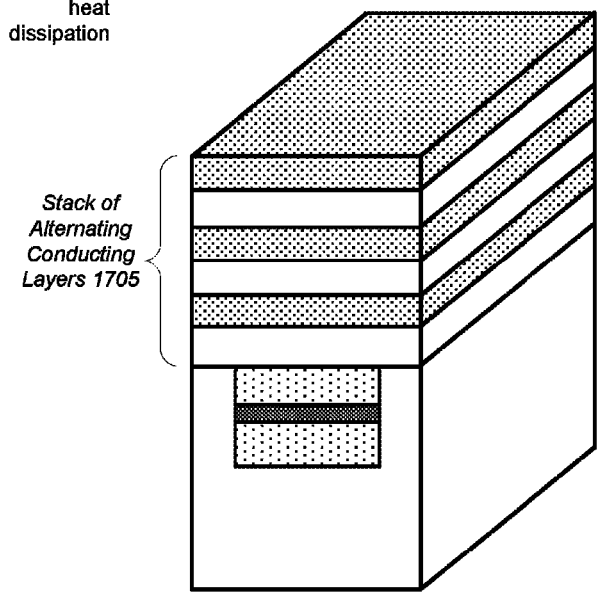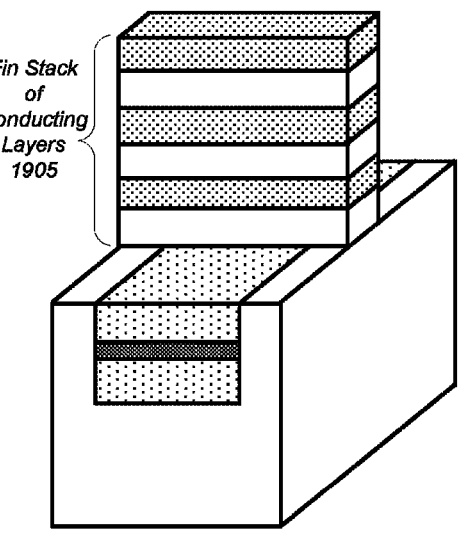
FIG. 16
FIG. 17
FIG. 18
FIG. 19

GATE ALL AROUND DEVICE ARCHITECTURE WITH LOCAL OXIDE

BACKGROUND

Description of the Relevant Art

The power consumption of modern integrated circuits has become an increasingly important design issue with each generation of semiconductor chips. Integrated circuit power dissipation constraints are not only an issue for portable computers and mobile communication devices, but also for high-performance microprocessors which can include multiple processor cores and multiple pipelines within a core. Design techniques, such as clock disabling and the use of power states, are used to reduce power consumption while maintaining high performance. In addition, fabrication techniques, such as using the silicon on insulator (SOI) fabrication process rather than the silicon bulk process, are used to reduce power consumption while maintaining high performance.

For multiple decades, planar transistors (devices) have been fabricated for use in integrated circuits. However, as the transistor dimensions decrease in order to increase performance and increase functionality for a same amount of on-die real estate, the short channel effects increase. Leakage current is one of the short channel effects. Power consumption increases with leakage current. Other short channel effects include parasitic capacitance to the silicon substrate and to the wells used for the source and drain regions, latchup effects, drain-induced barrier lowering (DIBL), punchthrough, performance dependency on temperature, impact ionization and so forth.

Non-planar transistors are a recent development in semiconductor processing for reducing short channel effects. Tri-gate transistors, Fin field effect transistors (FETs) and gate all around (GAA) transistors are examples of non-planar transistors. However, fabrication requirements of these devices can limit manufacturability. Additionally, as transistor dimensions decrease, the parasitic leakage paths between the source region and the drain region may still become problematic.

As mentioned earlier, using silicon on insulator (SOI) technology in place of bulk complementary metal-oxide-semiconductor (CMOS) technology also reduces short channel effects. However, the heat sourced by the encapsulated transistors in a SOI wafer is unable to transport to the back of the silicon substrate. Further manufacturing steps can be used to create a heat sink. For example, after the transistor is fabricated, multiple plugs are formed that extend through the thickness of the bulk silicon layer to the barrier oxide layer. The multiple plugs allow heat generated by device operation to sink through the bulk silicon layer to the back surface of the wafer. However, the multiple plugs increase manufacturing costs and can include retooling manufacturing components.

In view of the above, efficient methods and systems for fabricating non-planar devices while managing short channel and heating effects are desired.

BRIEF DESCRIPTION OF THE DRAWINGS

FIG. 1 is a generalized diagram of a cross-sectional view of a device being fabricated.

FIG. 2 is a generalized diagram of another cross-sectional view of a device being fabricated.

FIG. 3 is a generalized diagram of another cross-sectional view of a device being fabricated.

FIG. 4 is a generalized diagram of another cross-sectional view of a device being fabricated.

FIG. 9 is a generalized diagram of another cross-sectional view of a device being fabricated.

FIG. 10 is a generalized diagram of another cross-sectional view of a device being fabricated.

FIG. 16 is a generalized diagram of another cross-sectional view of a device being fabricated.

FIG. 17 is a generalized diagram of another cross-sectional view of a device being fabricated.

FIG. 18 is a generalized diagram of another cross-sectional view of a device being fabricated.

FIG. 19 is a generalized diagram of another cross-sectional view of a device being fabricated.

Figure 5:
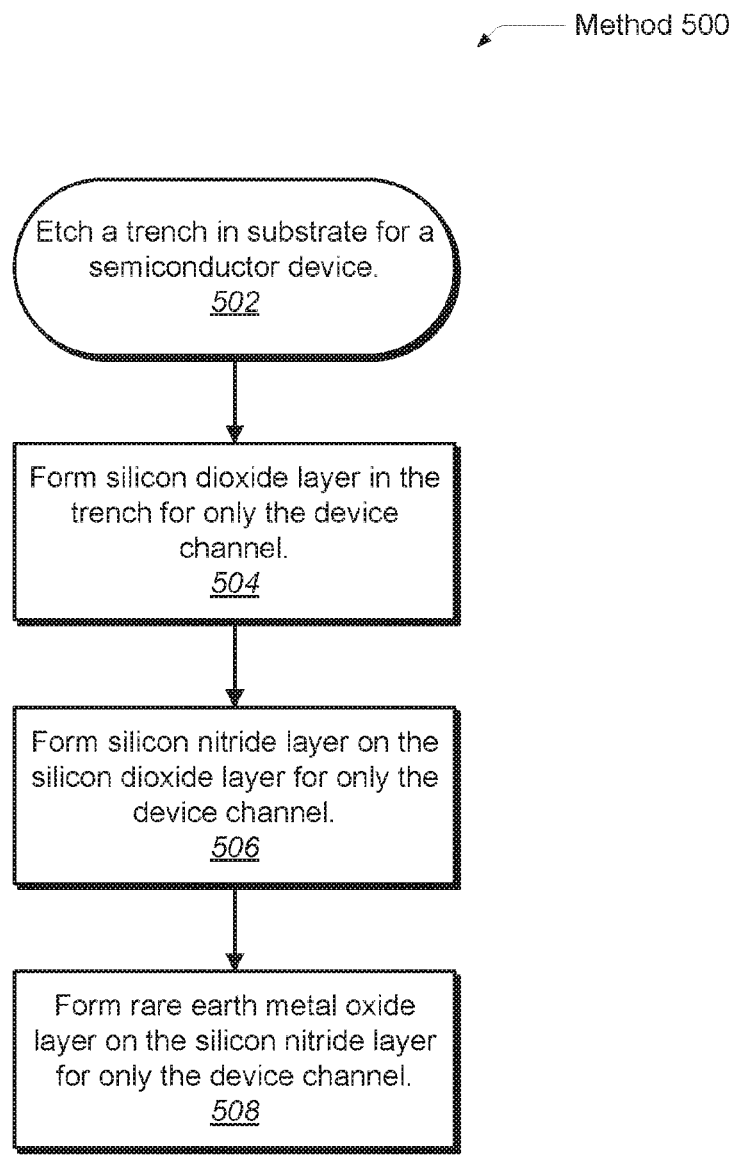
FIG. 5 is a generalized diagram of a method for forming a local silicon on insulator (SOI).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for fabricating non-planar devices while managing short channel and heating effects are contemplated. In various embodiments, a semiconductor device fabrication process includes forming a non-planar device, or transistor, where the body of the device is insulated from the silicon substrate, but the source and drain regions are not insulated from the silicon substrate. The process builds a local silicon on insulator (SOI) which insulates the body of the device from the silicon substrate while not insulating the source and drain regions from the silicon substrate.

The semiconductor device fabrication process includes etching a trench in silicon. The trench has a length as long as at least a channel length while being bounded by a site for a source region and a site for a drain region. In other words, the source and drain regions will not be included in the trench. A relatively thick silicon dioxide layer is formed in the trench on top of the silicon substrate. In some embodiments, a nitride layer is formed on top of the silicon dioxide layer. A relatively thick oxide layer is formed at the top of the trench.

If a nitride layer is used, the formed oxide layer is on top of the nitride layer. Therefore, the trench is filled with a relatively thick silicon dioxide layer at the bottom, the nitride layer in the middle and the relatively thick oxide layer at the top. In various embodiments, the relatively thick oxide layer at the top includes rare earth metal oxide such as one of lanthanum oxide, cerium oxide and gadolinium oxide. In other embodiments, the relatively thick oxide layer at the top includes silicon dioxide. The filled trench provides the local SOI that will isolate a later-formed gate region from the silicon substrate and consequently will reduce the capacitive coupling. Additionally, the trench filled with the above layers does not run underneath sites for the source and drain regions, which will allow generated heat by the later operating device to transport through the silicon substrate to the back of the wafer.

The semiconductor device fabrication process continues by forming nanowires of a gate region from a stack of silicon layers or silicon germanium layers. In various embodiments, each of the oxide layer and the silicon dioxide layer in the trench has a thickness at least an order of magnitude greater than a thickness of the silicon dioxide layer formed on the nanowires in the gate. When one or more nanowires are residing on top of the oxide layer at the top of the trench, the process further includes etching a second trench into the oxide layer and depositing gate metal in the second trench for the nanowires residing on top of the oxide layer.

In the upcoming description of FIGS. 1-12 describe the fabrication steps for a non-planar semiconductor device which also manages short channel and heating effects. Turning to FIG. 1, a generalized block diagram of a cross-sectional view of a portion of a semiconductor device being fabricated is shown. As shown, the silicon substrate 105 of a wafer has a trench etched into it. In various embodiments, a dry etch process is used to etch the trench. Portions of the silicon substrate 105 not protected by a mask layer are immersed in plasma, which is a reactive gas. The unprotected layer, which is the silicon substrate 105 in this case, is removed by chemical reactions and/or ion bombardment. The reaction products are carried away in the gas stream.

Plasma etching processes can operate in one of multiple modes by adjusting the parameters of the etching process. Some plasma etching processes operate with a pressure between 0.1 torr and 5 torr. In various embodiments, the source gas for the plasma contains chlorine or fluorine. For example, carbon tetrachloride (CCl4) is used to etch silicon and aluminum. Trifluoromethane (CHF3) is used to etch silicon dioxide and silicon nitride. A source gas for plasma containing oxygen is used to oxidize ("ash") photoresist, which facilitates the removal of the photoresist.

The plasma etching process can be isotropic, i.e., exhibiting a lateral undercut rate on a patterned surface approximately the same as the downward etch rate. A plasma etching process which produces energetic neutrally charged free radicals that react at the surface of the unprotected layer such that the reactions occur from all angles on the unprotected layer is an isotropic process. A plasma etching process can also be anisotropic, i.e., exhibiting a smaller lateral undercut rate than the downward etch rate. An anisotropic plasma etching process is used in deep reactive ion etching.

Ion milling, or sputter etching processes, uses lower pressures, such as on the scale of 10 millipascals versus a hundred pascals of the above processes, and bombards the unprotected layer (not covered by the mask layer) with energetic ions of noble gases. Argon is typically used as the noble gas. The energetic ions knock atoms from the unprotected layer, such as the silicon substrate 105, by transferring momentum. The energetic ions react with the unprotected layer typically from a single direction, which causes the sputter etching process to be anisotropic. Sputter etching processes typically include relatively poor selectivity.

A reactive-ion etching (ME) process generates a plasma by an electromagnetic field under a relatively low pressure to remove material deposited on wafers. A deep reactive-ion etching (DRIE) process is a relatively high anisotropic etch process used to create deep penetration in the unprotected layer for steep-sided holes and trenches.

In addition to selecting the etching process, each of the masking material used to protect portions of the layer being etched, the etch rate and the etching time are selected to create the trench in the silicon substrate 105 of FIG. 1 with a length at least as long as a channel length of the semiconductor device being fabricated. The length of the trench is shown as "L1." The length of the trench, L1, is also bounded by a site for a source region and a site for a drain region to be added in a later fabrication step. Therefore, the length of the trench, L1, does not span the length of the semiconductor device being fabricated.

Following, a silicon dioxide (SiO2) layer 110 of a controlled thickness is formed. In various embodiments, a plasma-enhanced chemical vapor deposition (PECVD) process is used to deposit a thin film of silicon dioxide from a gas state (vapor) to a solid state on the silicon substrate 105. The PECVD process introduces reactant gases between a grounded electrode and a parallel radio frequency (RF) energized electrode. The capacitive coupling between the electrodes excites the reactant gases into a plasma, which induces a chemical reaction and results in the reaction product being deposited on the silicon substrate 105. The silicon dioxide 110 can be deposited using a combination of gasses such as dichlorosilane or silane with oxygen precursors, such as oxygen and nitrous oxide, typically at pressures from a few millitorr to a few torr. The thickness of the silicon dioxide layer 110 is relatively thick. For example, the thickness of the silicon dioxide layer 110 is at least an order of magnitude greater than a thickness of a thin gate silicon dioxide layer formed in a later processing step.

After the silicon dioxide layer 110 is deposited, it is etched to the desired thickness. A chemical mechanical planarization (CMP) step is used to remove unwanted silicon dioxide and to polish the remaining silicon dioxide layer 110 on the silicon wafer. The CMP step achieves a near-perfect flat and smooth surface upon which further layers of integrated circuitry are built.

Referring to FIG. 2, a generalized block diagram of another cross-sectional view of a portion of a semiconductor device being fabricated is shown. As shown, a silicon nitride (SiNx) layer 205 is deposited on the silicon dioxide layer 110 and the silicon substrate 105. The chemical and electrical properties of amorphous hydrogenated silicon nitride (SiNx) makes this material a good candidate for an insulating layer in integrated circuits. In some embodiments, the silicon nitride layer 205 is formed from silane (SiH4) and ammonia (NH3) with the plasma enhanced chemical vapor deposition (PECVD) technique. In other embodiments, the silicon nitride layer 205 is formed with the low pressure chemical vapor deposition (LPCVD) technique.

Turning now to FIG. 3, a generalized block diagram of another cross-sectional view of a portion of a semiconductor device being fabricated is shown. As shown, the silicon nitride layer 205 has been etched. A chemical mechanical planarization (CMP) step is used to remove unwanted silicon nitride from on top of the silicon substrate 105 and etched step from within the trench. The silicon nitride layer 205 has been etched with and fluorine-containing mixtures. The silicon nitride layer 205 and the silicon dioxide layer 110 provide an insulating layer for the non-planar semiconductor device being fabricated.

Following the CMP step for the silicon nitride layer 205, a rare earth metal oxide layer 305 is formed. The rare earth metal oxide layer 305 includes one of multiple rare earth metal oxides. For example, the rare earth metal oxide layer 305 can include one of lanthanum oxide (La2O3), cerium oxide (CeO2) and gadolinium oxide (Gd2O3). Other rare earth metal oxides are also possible and contemplated for use in the rare earth metal oxide layer. The rare earth metal oxide layer 305 has a relatively high band gap, a relatively low lattice energy and a relatively high dielectric constant. The rare earth metal compounds typically include relatively high vapor pressures, relatively low melting points, availability in the liquid state, relatively high reactivity towards water, and relatively high growth rates for deposition.

The rare earth metal oxide layer 305 is deposited at an elevated temperature by one of many techniques such as chemical vapor disposition, atomic layer deposition, metal organic chemical vapor deposition (MOCVD), thermal oxidation, sputtering, and spray pyrolysis. Oxides with a relatively high dielectric constant typically include more defects than thermally grown silicon dioxide. Therefore, an oxygen treatment is later performed, which also reduces the short channel effects such as leakage current and lowers the interface state density.

Referring now to FIG. 4, a generalized block diagram of another cross-sectional view of a portion of a semiconductor device being fabricated is shown. As shown, the rare earth metal oxide layer 305 has been CMP polished. A chemical mechanical planarization (CMP) step is used to remove unwanted rare earth metal oxide from on top of the silicon substrate 105. The CMP step also polishes the remaining rare earth metal oxide for a further layer to be formed on top. The rare earth metal oxide layer 305, the silicon nitride layer 205 and the silicon dioxide layer 110 provide an insulating layer for the non-planar semiconductor device being fabricated.

Referring now to FIG. 5, one embodiment of a method 500 for forming a local silicon on insulator (SOI) is shown. For purposes of discussion, the steps in this embodiment (as well as in FIG. 20) are shown in sequential order. However, in other embodiments some steps occur in a different order than shown, some steps are performed concurrently, some steps are combined with other steps, and some steps are absent.

A trench is etched into a silicon substrate for a semiconductor device (block 502). The masking material, etch rate and etching time are selected to create the trench with a length at least as long as a channel length of the semiconductor device being fabricated. The length of the trench is also bounded by a site for a source region and a site for a drain region to be added in a later fabrication step. Therefore, the length of the trench does not span the length of the semiconductor device being fabricated.

Afterward, a silicon dioxide (SiO2) layer is formed in the trench for only the device channel (block 504). The silicon dioxide layer is formed by deposition, etching and a chemical mechanical planarization (CMP) step used to remove unwanted silicon dioxide and to polish the remaining silicon dioxide layer on the silicon wafer. Following, a silicon nitride (SiNx) layer is formed on the silicon dioxide layer for only the device channel (block 506). The silicon nitride layer is formed with deposition, etching and CMP as well. At the top of the trench and on top of the silicon nitride layer, a rare earth metal oxide layer is formed for only the device channel (block 508). The rare earth metal oxide layer includes one of multiple rare earth metal oxides. For example, the rare earth metal oxide layer can include one of lanthanum oxide (La2O3), cerium oxide (CeO2) and gadolinium oxide (Gd2O3). Other rare earth metal oxides are also possible and contemplated for use in the rare earth metal oxide layer.

The stack from top to bottom within the trench includes the rare earth metal oxide layer, the silicon nitride layer and the silicon dioxide layer. This stack within the trench provides a local insulating layer for a non-planar semiconductor device being fabricated. The local SOI does not span the length of the semiconductor device being fabricated as is done with typical SOI. Rather, the length of the local SOI within the trench is bounded by a site for a source region and a site for a drain region to be added in a later fabrication step. Consequently, the semiconductor device (transistor) is not encapsulated by the local SOI and a passage exists on either side of the trench to allow heat generated by later device operation to sink through the bulk silicon substrate to the back surface of the wafer.

Figure 6:
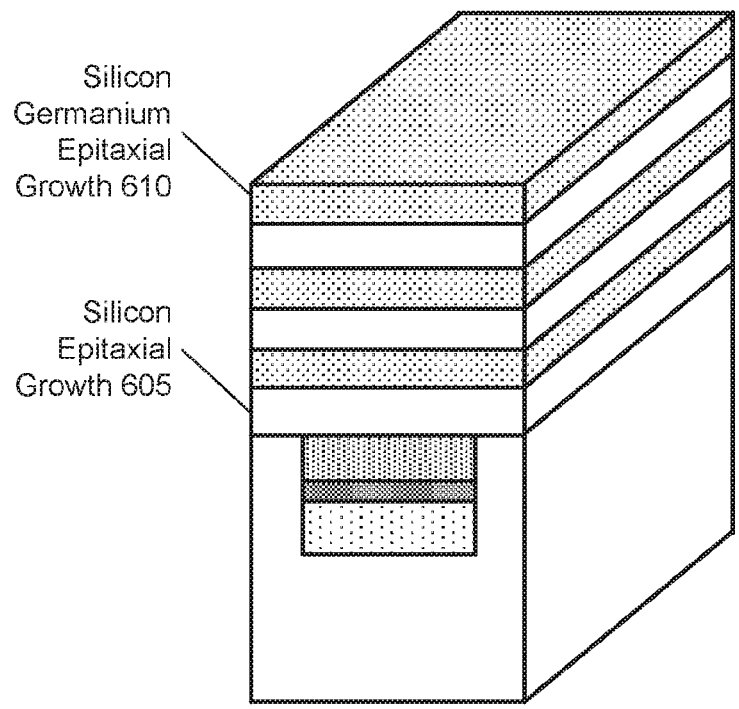
FIG. 6 is a generalized diagram of another cross-sectional view of a device being fabricated.

Turning now to FIG. 6, a generalized block diagram of another cross-sectional view of a portion of a semiconductor device being fabricated is shown. Here, alternating conduction layers are grown on top of the rare earth metal oxide layer 305 and the silicon substrate 105. A silicon epitaxial growth 605 is grown first followed by a silicon germanium epitaxial growth 610, and then the layers 605 and 610 alternate. The silicon epitaxial growth 605 is grown by using vapor-phase epitaxy (VPE), which is a modification of chemical vapor deposition (CVD, or a molecular-beam and liquid-phase epitaxy (MBE and LPE) are used. The silicon germanium epitaxial growth 610 is grown by an elevated temperature two-step process with a hydrogen anneal where a thin low temperature germanium first buffer layer is grown followed by a thicker high temperature germanium layer grown on top. The alternating semiconductor layers 605 and 610 are grown to later form nanowires for the gate region.

Figure 7:
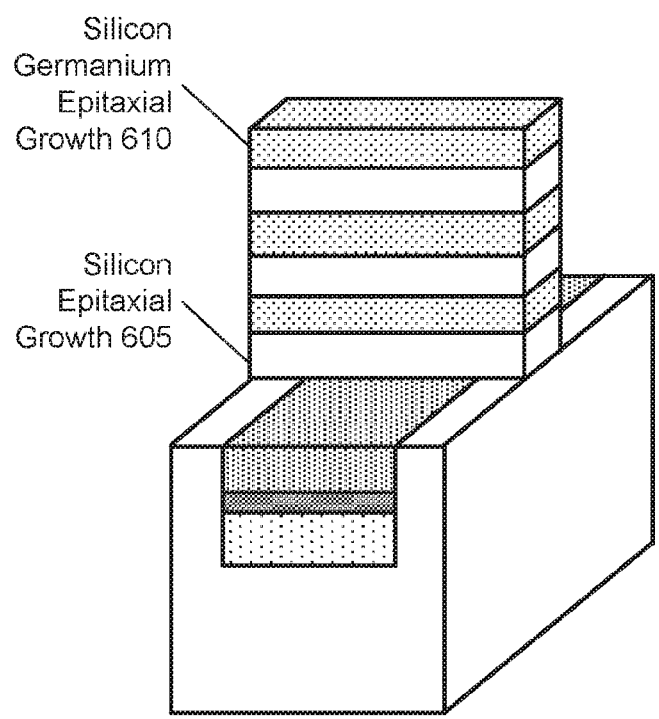
FIG. 7 is a generalized diagram of another cross-sectional view of a device being fabricated.

Referring now to FIG. 7, a generalized block diagram of another cross-sectional view of a portion of a semiconductor device being fabricated is shown. Here, a Fin pattern is created from the alternating semiconducting layers 605 and 610. Silicon Fins with a relatively small pitch but with dimensions suitable for field effect transistors can be formed by multiple processes. In various embodiments, the silicon Fins are formed with a sidewall image transfer (SIT) process. In other embodiments, the silicon Fins are formed with extreme ultraviolet (EUV) lithography. In yet other embodiments, the silicon Fins are formed by directed self-assembly (DSA) patterning via chemoepitaxy or self-aligned customization.

Figure 8:
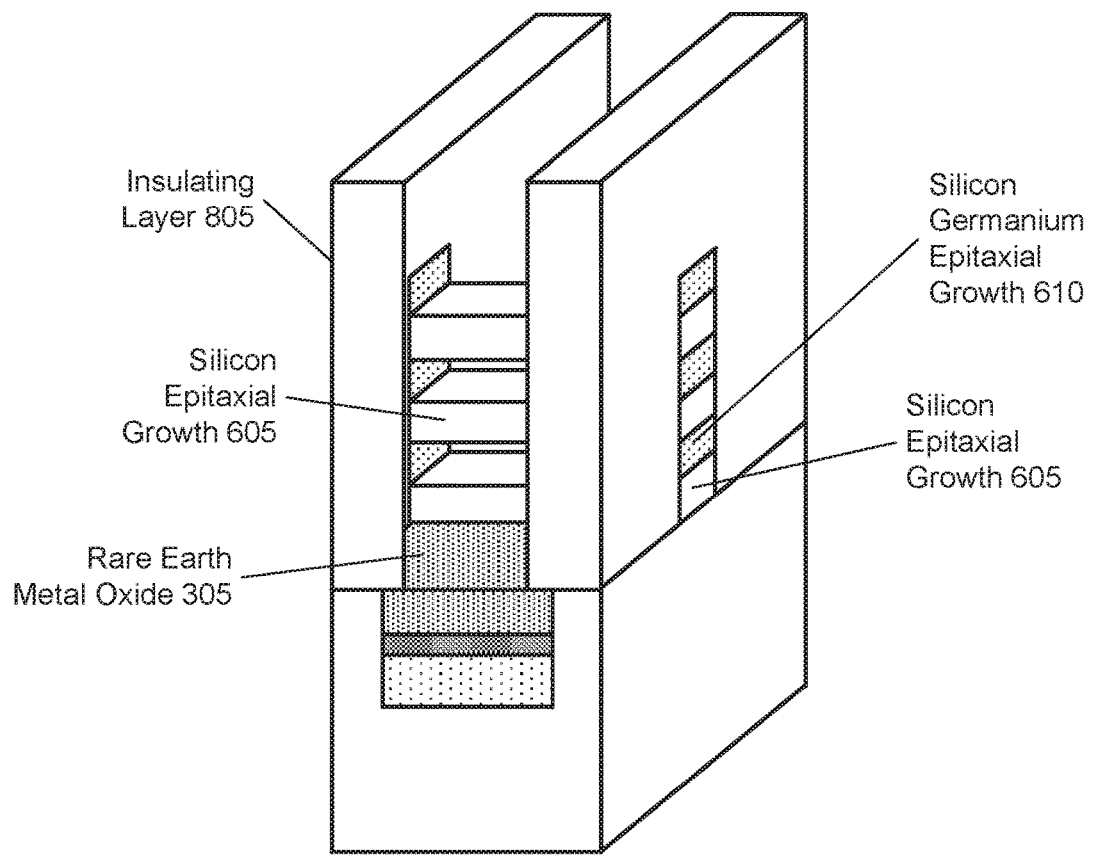
FIG. 8 is a generalized diagram of another cross-sectional view of a device being fabricated.

Turning now to FIG. 8, a generalized block diagram of another cross-sectional view of a portion of a semiconductor device being fabricated is shown. Here, an insulating layer 805 is deposited around the Fin pattern of alternating semiconducting layers 605 and 610. The insulating layer 805 includes one or more of silicon dioxide and silicon nitride. The insulation layer 805 is etched to expose the alternating conduction layers 605 and 610 in the gate region to be formed later. A given conduction layer of the layers 605 and 610 is selected to remain for forming the gate region. Afterward, any semiconducting layer of the layers 605 and 610 other than the selected layer is removed. For example, the silicon growth 605 is chosen to remain. Therefore, a portion of the silicon germanium growth 610 is removed from the alternating stack. The portion of the silicon germanium growth 610 being removed has a length equal to at least the channel length.

Referring now to FIG. 9, a generalized block diagram of another cross-sectional view of a portion of a semiconductor device being fabricated is shown. As shown, a spacer 905 is formed in the inner walls of the insulating layer 805 by being deposited and etched. In various embodiments, the spacer 905 includes silicon nitride. In other embodiments, the spacer 905 is a combination of silicon dioxide and silicon nitride. A generalized block diagram of another cross-sectional view of a portion of a semiconductor device being fabricated is shown in FIG. 10. Here, the rare earth metal oxide layer 305 is etched to create space for a later deposition of gate metal. In various embodiments, the rare earth metal oxide layer 305 is etched when one or more conduction layers 605 reside on top of the rare earth metal oxide layer 305.

Following the etch of the rare earth metal oxide layer 305, a relatively thin silicon dioxide layer is grown on the semiconducting layers 605 to provide nanowires 1005 in the gate region. In some examples, the nanowires 1005 can have a thickness of 5-7 nanometers, whereas the gate silicon dioxide layer (shell) has a thickness ranging from 1 nanometer to 10-15 angstroms. A dry oxidation processing step at an elevated temperature is used to form the relatively thin oxide shell on the nanowires 1005. Following, a high-k dielectric, such as hafnium oxide (HfO2), can be deposited on the oxide shell on the nanowires 1005 using an atomic layer deposition (ALD). The high-k dielectric may also be referred to as a high-k film.

Figure 11:
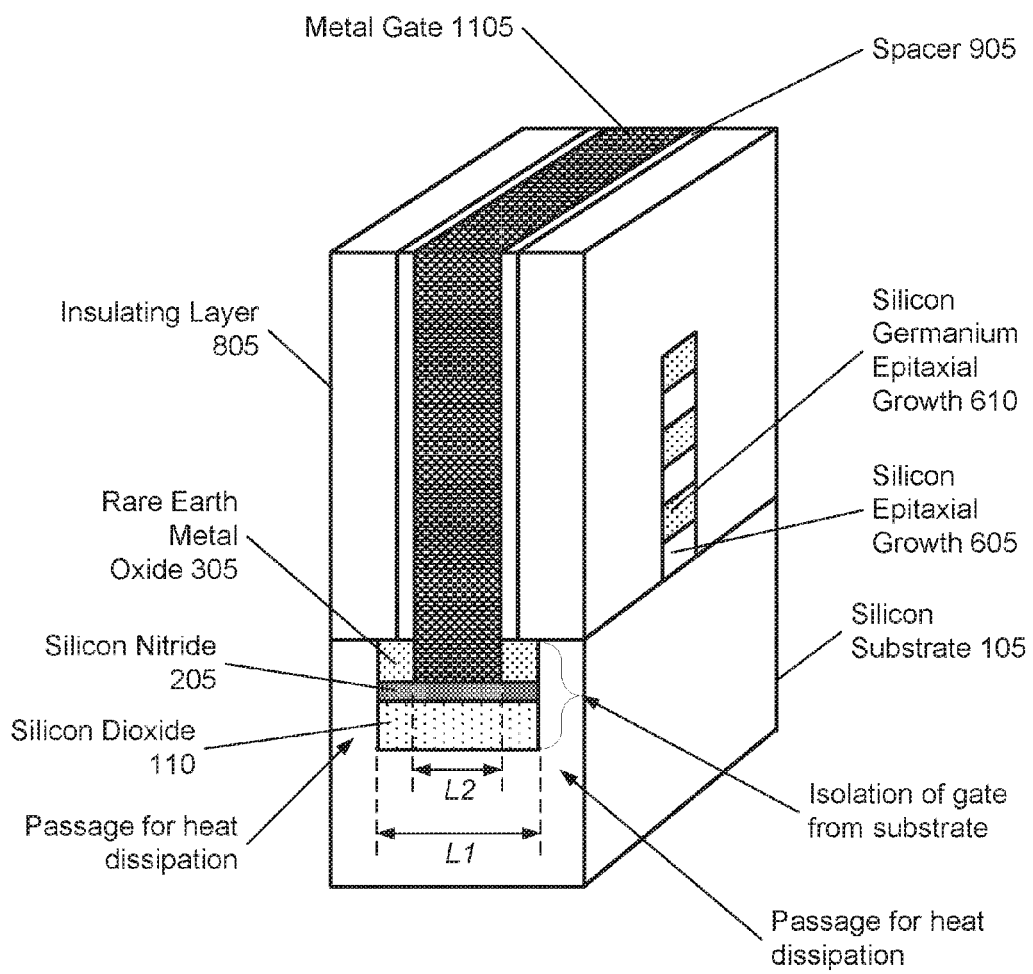
FIG. 11 is a generalized diagram of another cross-sectional view of a device being fabricated.

Referring now to FIG. 11, a generalized block diagram of another cross-sectional view of a portion of a semiconductor device being fabricated is shown. As shown, gate metal material 1105 is deposited followed by CMP steps to polish the gate metal 1105. In various embodiments, titanium nitride (TiN) is used for the gate metal 1105. The gate metal 1105 is provided around the nanowires 1005 and within the trench in the rare earth metal oxide layer 305. The length of the second trench etched into the rare earth metal oxide layer 305 is shown as length L2. The length L2 is smaller than the length, L1, of the first trench etched into the silicon substrate 105. The gate metal 1105 wrapped around the nanowires 1005 provides the gate region of the gate all around (GAA) device being fabricated.

The stack of the rare earth metal oxide layer 305, the silicon nitride 205 and silicon dioxide 110 provides a local silicon on insulator (SOI) where the gate region is isolated from the silicon substrate 105. Therefore, the capacitive coupling between the gate region and the silicon substrate 105 is reduced. However, the local SOI does not span the length of the semiconductor device being fabricated as is done with typical SOI. Rather, the local SOI has the length L1 and is bounded by a site for a source region and a site for a drain region to be added in a later fabrication step. Consequently, the semiconductor device (transistor) is not encapsulated by the local SOI and a passage exists on either side of the trench to allow heat generated by device operation to sink through the bulk silicon substrate 105 to the back surface of the wafer.

Figure 12:
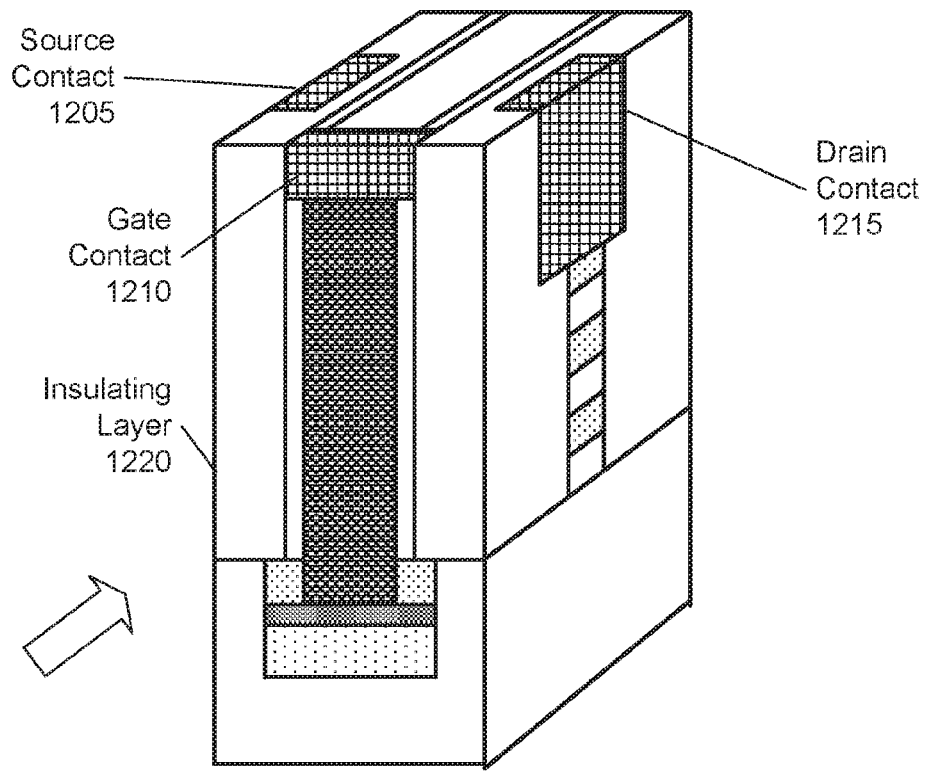
FIG. 12 is a generalized diagram of another cross-sectional view of a device being fabricated.

A generalized block diagram of another cross-sectional view of a portion of a semiconductor device being fabricated is shown in FIG. 12. As shown, contacts have been formed on the semiconductor device. A source contact 1205 for the source region, a gate contact 1210 and a drain contact 1215 for the drain region are formed. In some embodiments, silicide contacts are formed at both ends of the silicon nanowires 1005 providing low resistive contacts 1205 and 1210 for the source region and the drain region.

Figure 13:
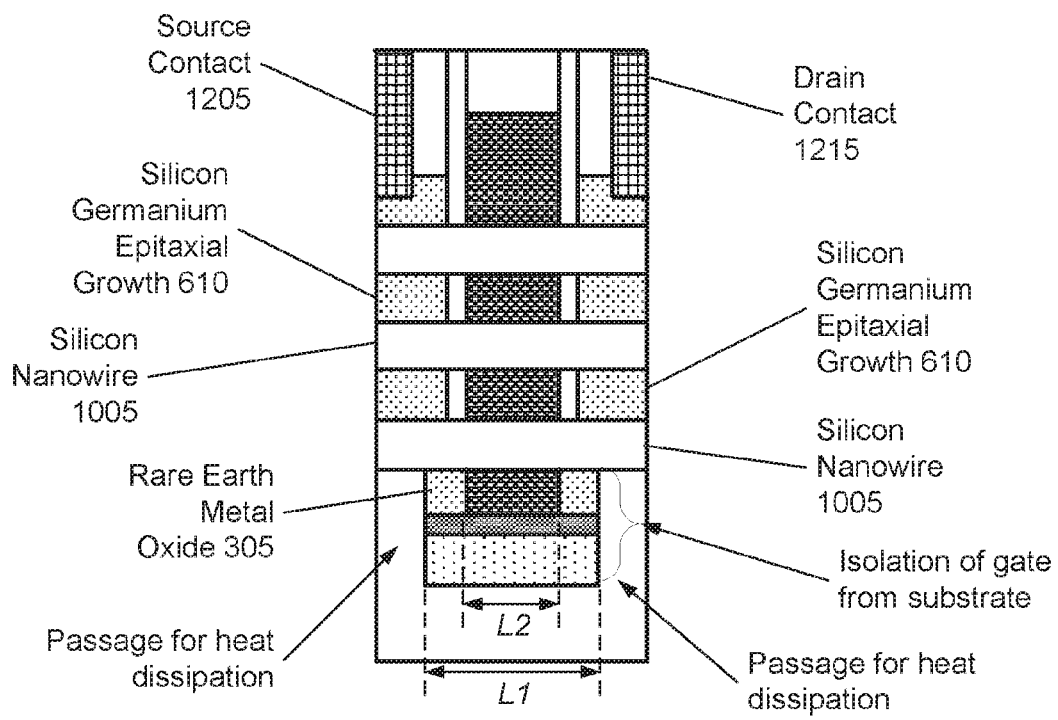
FIG. 13 is a generalized diagram of a cross-sectional view from the front of the semiconductor device being fabricated.

Between depositing the metal gate 1105 and forming the contacts 1205-1215, the insulating layer 805 is etched away followed by the source region and the drain region are formed by an implantation process. Afterward, another insulating layer 1220 is deposited, but this time around the alternating portions of the conduction layers 605 and 610 of the stack outside of the silicon nitride spacers. Turning now to FIG. 13, a generalized block diagram of a cross-sectional view from the front of the semiconductor device being fabricated is shown. As shown, the nanowires 1005 are shown horizontally between the source region and the drain region. The metal gate is shown throughout the gate region and around the nanowires 1005 to provide a gate all around GAA) semiconductor device. In addition, the metal gate 1005 is within the trench in the rare earth metal oxide layer 305. As described earlier, the stack of the rare earth metal oxide layer 305, the silicon nitride 205 and silicon dioxide 110 provides the local silicon on insulator (SOI) where the gate region is isolated from the silicon substrate 105. As the local SOI does not span the length of the semiconductor device being fabricated as is done with typical SOI, passages exist for dissipating heat generated by device operation.

Figure 14:
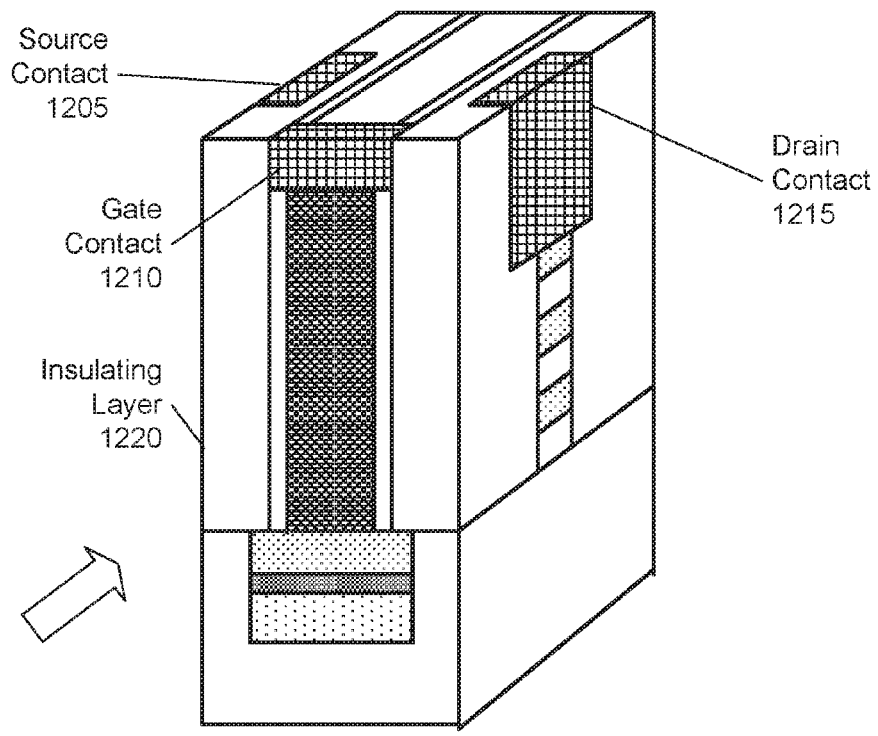
FIG. 14 is a generalized diagram of another cross-sectional view of a device being fabricated.

A generalized block diagram of another cross-sectional view of a portion of a semiconductor device being fabricated is shown in FIG. 14. Similar to the cross-sectional view shown earlier in FIG. 12, contacts have been formed on the semiconductor device. A source contact 1205 for the source region, a gate contact 1210 and a drain contact 1215 for the drain region are formed. However, in this semiconductor device, the silicon germanium semiconducting layer 610 is selected for the nanowires. The silicon germanium semiconducting layer 610 was grown second and on top of the silicon semiconducting layer 605. Therefore, the selected semiconducting layer for nanowires (the silicon germanium semiconducting layer 610 in this embodiment) does not reside on top of the silicon substrate 105 and the rare earth metal oxide 305. As the silicon germanium growth 610 is chosen to remain, a portion of the silicon growth 605 is removed from the alternating stack. The portion of the silicon growth 605 being removed has a length equal to at least the channel length. A relatively thin silicon dioxide layer is grown on the semiconducting layers 610 to provide nanowires in the gate region. In various embodiments, silicide contacts are formed at both ends of the silicon germanium nanowires providing low resistive contacts 1205 and 1210 for the source region and the drain region.

Figure 15:
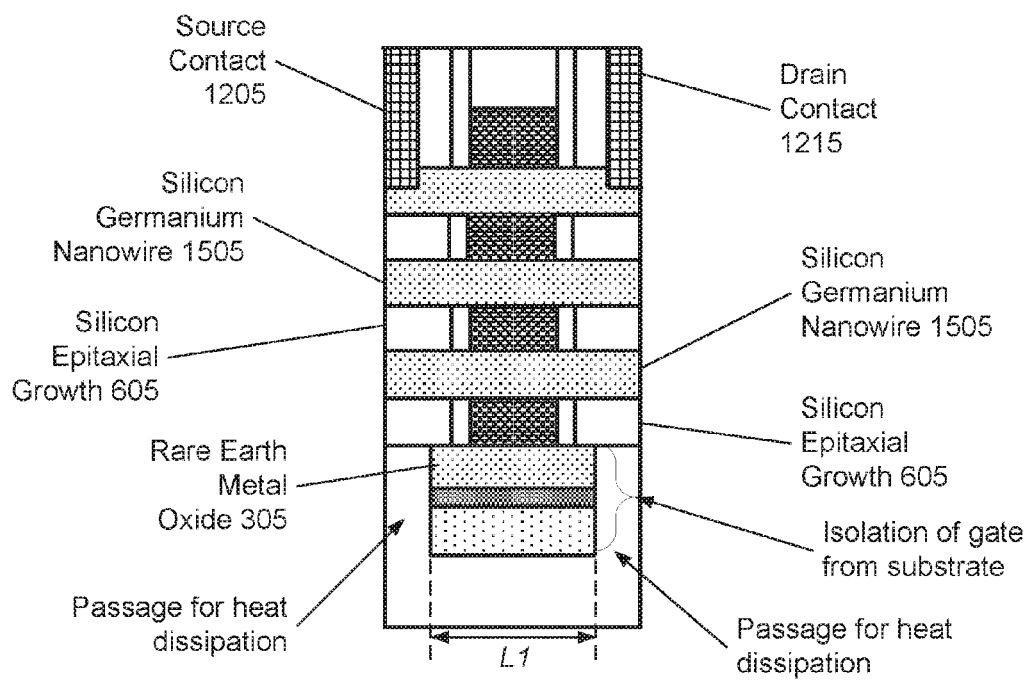
FIG. 15 is a generalized diagram of another cross-sectional view of a device being fabricated.

Turning now to FIG. 15, a generalized block diagram of a cross-sectional view from the front of the semiconductor device being fabricated is shown. As shown, the silicon germanium nanowires 1505 are shown horizontally between the source region and the drain region. The metal gate 1005 is shown throughout the gate region and around the nanowires 1505 to provide a gate all around GAA) semiconductor device. The metal gate 1005 is not within the trench in the rare earth metal oxide layer 305 as the silicon germanium conduction layer 610 does not reside on top of the silicon substrate 105 and the rare earth metal oxide layer 305. As described earlier, the stack of the rare earth metal oxide layer 305, the silicon nitride 205 and silicon dioxide 110 provides the local silicon on insulator (SOI) where the gate region is isolated from the silicon substrate 105. As the local SOI does not span the length of the semiconductor device being fabricated as is done with typical SOI, passages exist for dissipating heat generated by device operation.

It is noted that the order of the growth of the semiconducting layers, such as the silicon semiconducting layer 605 and the silicon germanium semiconducting layer 610, can be reversed. For example, the silicon germanium semiconducting layer 610 can be grown on top of the silicon substrate 105 and the rare earth metal oxide 305. Referring again to FIG. 6 and FIG. 7, the bottom of the stack would begin with the silicon germanium semiconducting layer 610 followed by growth of the silicon semiconducting layer 605 and the alternating pattern repeats. Referring again to FIGS. 8-10, if the selected semiconducting layer to remain resides on top of the silicon substrate 105 and the rare earth metal oxide 305, then a trench is etched into the rare earth metal oxide 305. Otherwise, no additional trench is used. In some embodiments, the silicon semiconducting layer 605 is selected to remain for building n-channel semiconductor devices while the silicon germanium semiconducting layer 610 is selected to remain for building p-channel semiconductor devices. It is also noted that other materials may be used for the semiconducting layers. For example, gallium arsenide (GaAs) can be used for building n-channel semiconductor devices.

Other cross-sectional views of a portion of a semiconductor device being fabricated are shown in FIGS. 16-19. In FIG. 16, a generalized block diagram of a cross-sectional view of a portion of a semiconductor device being fabricated is shown. Similar to the cross-sectional view of FIG. 1, the silicon substrate 105 of a wafer has a trench etched into it. The length of the trench, L1, is also bounded by a site for a source region and a site for a drain region to be added in a later fabrication step. Therefore, the length of the trench, L1, does not span the length of the semiconductor device being fabricated. The trench is filled with a silicon dioxide layer 110, a silicon nitride layer 205 and another silicon dioxide layer 1610. The trench provides a local SOI for a gate to be later formed. In addition, passageways on either side of the trench allow heat that will later be generated by an operating device to sink through the bulk silicon substrate to the back surface of the wafer.

Turning now to FIG. 17, a generalized block diagram of another cross-sectional view of a portion of a semiconductor device being fabricated is shown. Here, a stack of alternating semiconducting layers 1705 is grown separate from the silicon substrate 105. The stack 1705 can include a silicon semiconducting layer, a silicon germanium semiconducting layer, a gallium arsenide semiconducting layer and so forth. The stack 1705 is bonded to the top of the silicon substrate 105 and the silicon dioxide layer 1710 with any of a number of wafer to wafer bonding techniques. The bonded structure is shown in FIG. 18 where the stack 1705 is adhered to the top of the silicon substrate 105 and the silicon dioxide layer 1710. In FIG. 19, a Fin pattern 1905 for the stack of alternating semiconducting layers is formed on the top of the silicon substrate 105 and the silicon dioxide layer 1710. The formation of the Fin pattern is similar to the steps described earlier for FIG. 7. Once the Fin pattern 1905 is formed, the fabrication steps described earlier for FIGS. 8-15 can be used to complete the non-planar semiconductor device with local SOI to manage short channel and heating effects.

Figure 20:
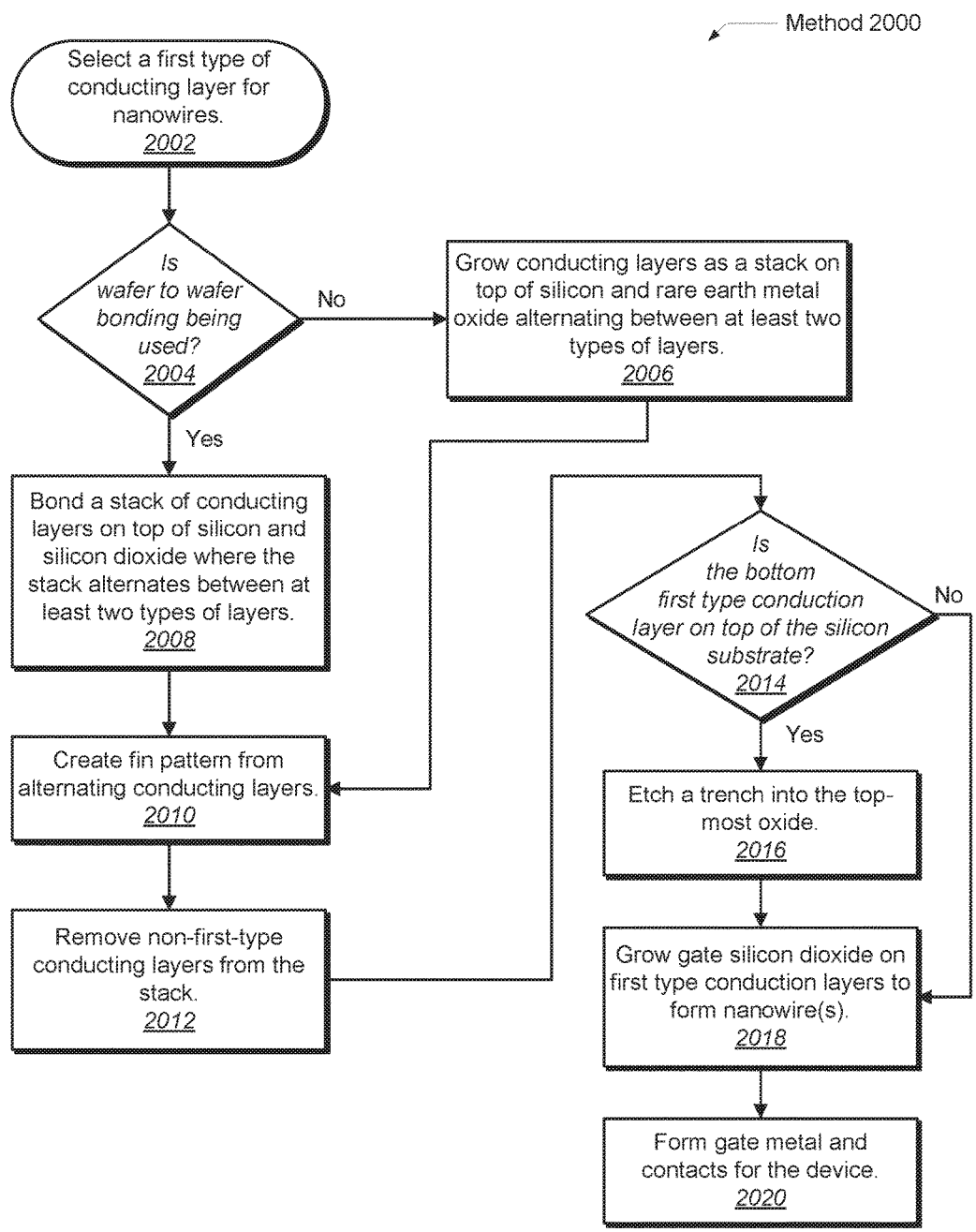
FIG. 20 is a generalized diagram of a method for forming nanowires for a non-planar semiconductor device with local silicon on insulator (SOI).

Turning now to FIG. 20, one embodiment of a method 2000 for forming nanowires for a non-planar semiconductor device with local silicon on insulator (SOI) is shown. The method 2000 is used after a local SOI is formed, such as performing the steps in method 500. A first type of semiconducting layer is selected for nanowires (block 2002). The first type includes one of silicon, silicon germanium and so forth. If wafer to wafer bonding is not used (conditional block 2004, "no" leg), then at least two types of conduction layers are grown as alternating layers in a stack on top of the silicon substrate of the wafer and the rare earth metal oxide layer (block 2006). For example, the first type of semiconducting layer, such as silicon, is grown on top of the silicon substrate of the wafer and the rare earth metal oxide layer. A second type of semiconducting layer, such as silicon germanium, is grown on top of the first type of semiconducting layer. Afterward, the first type of semiconducting layer is grown on top of the second type of semiconducting layer, and the alternating growth steps repeat. Alternatively, the second type of semiconducting layer is grown first and on top of the silicon substrate of the wafer and the rare earth metal oxide layer. The first type of semiconducting layer is grown on the second type of semiconducting layer and the alternating growth steps repeat.

If wafer to wafer bonding is used (conditional block 2004, "yes" leg), then a stack of alternating semiconducting layers grown separate from the silicon substrate is bonded on top of the silicon substrate (block 2008). Any of a number of wafer to wafer bonding techniques can be used. In various embodiments when wafer to wafer bonding is used, the top oxide layer in the trench is silicon dioxide rather than a rare earth metal oxide. A Fin pattern is created from the alternating semiconducting layers (block 2010). Silicon Fins with a relatively small pitch but with dimensions suitable for field effect transistors are formed by directed self-assembly (DSA) patterning via chemoepitaxy or self-aligned customization. An insulating layer is deposited around the Fin pattern. The insulating layer can include silicon dioxide and silicon nitride. The insulation layer is etched to expose the alternating semiconducting layers in the gate region to be formed later.

The first type of conduction layer is selected to remain for forming the gate region. The non-first-type semiconducting layers are removed from the stack (block 2012). Depending on the order of the earlier growth steps for the alternating conduction layers, the first type of semiconducting layer can be directly on top of the silicon substrate of the wafer and the top-most oxide layer (silicon dioxide or rare earth metal oxide). If the bottom first type conduction layer is on top of the silicon substrate (conditional block 2014, "yes" leg), then a trench is etched into the top-most oxide (block 2016).

If the bottom conduction layer of the first type of conduction layers is not on top of the top-most oxide (conditional block 2014, "no" leg), then a relatively thin silicon dioxide layer is grown on the first type semiconducting layers to provide nanowires in the gate region (block 2018). Following, gate metal is provided around the nanowires and within any trench in the rare earth metal oxide (block 2020). In addition, silicide contacts are formed at both ends of the nanowires to provide low resistive contacts for the source region and the drain region. Between depositing the metal gate and forming the contacts, the insulating layer around the ends of the nanowires is etched away followed by an implantation process for the source region and the drain region. Afterward, another insulating layer is deposited, but this time around the alternating portions of the conduction layers and 610 of the stack outside of the silicon nitride spacers.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process comprising:
    etching a first trench in a silicon substrate, wherein a length of the first trench is at least a channel length of the device and is bounded by a site for a source region and a site for a drain region;
    forming at least an oxide layer on top of the first trench;
    placing a stack of semiconducting layers on top of both the oxide layer and silicon substrate, wherein the stack comprises a plurality of semiconducting layers that alternate between at least two types of semiconducting layers and a bottom of the stack makes contact with the silicon substrate on either side of the first trench;
    creating a fin pattern from the stack;
    removing a portion of semiconducting layers of any type other than a first type from the stack, wherein the portion has a length approximately equal to that of the channel length, and wherein semiconducting layers of the first type form nanowires in a gate region of the device; and
    forming a silicon layer, a silicon dioxide layer and a high-k film on the nanowires in the gate region.

2. The semiconductor device fabrication process as recited in claim 1, wherein an area of the stack of semiconducting layers making contact with the silicon substrate on either side of the first trench comprise the site for the source region and the site for the drain region.

3. The semiconductor device fabrication process as recited in claim 1, further comprising forming the oxide layer in the first trench with a thickness at least an order of magnitude greater than a thickness of the silicon dioxide layer formed on the nanowires.

4. The semiconductor device fabrication process as recited in claim 1, wherein prior to forming the oxide layer, the process further comprises:
    forming a silicon dioxide layer on the silicon substrate in the first trench; and
    forming a nitride layer on the silicon dioxide layer in the first trench, wherein the nitride layer is between the oxide layer and the silicon dioxide layer in the first trench.

5. The semiconductor device fabrication process as recited in claim 1, wherein the oxide layer comprises a rare earth metal oxide.

6. The semiconductor device fabrication process as recited in claim 5, wherein placing the stack of semiconducting layers comprises growing the plurality of semiconducting layers on top of both the oxide layer and the silicon substrate.

7. The semiconductor device fabrication process as recited in claim 1, wherein placing the stack of semiconducting layers comprises:
    growing the plurality of semiconducting layers to form a completed stack; and
    bonding the completed stack to the top of both the oxide layer and the silicon substrate.

8. The semiconductor device fabrication process as recited in claim 7, wherein the oxide layer is silicon dioxide.

9. The semiconductor device fabrication process as recited in claim 1, wherein when one or more nanowires are residing on top of the oxide layer, the process further comprises:
    etching a second trench into the oxide layer; and
    depositing gate metal in the second trench for the one or more nanowires.

10. The semiconductor device fabrication process as recited in claim 1, wherein the first type of semiconducting layer comprises one of silicon and silicon germanium.

11. A semiconductor device comprising:
    a silicon substrate comprising a first trench, wherein a length of the first trench is at least a channel length of the device and bounded by a site for a source region and a site for a drain region;
    an oxide layer on top of the first trench;
    a fin pattern formed from a stack of semiconducting layers on top of both the oxide layer and silicon substrate, wherein the stack comprises a plurality of semiconducting layers that alternate between at least two types of semiconducting layers and a bottom of the stack makes contact with the silicon substrate on either side of the first trench, and wherein a portion of semiconducting layers of any type other than a first type have been removed from the stack to form nanowires in a gate region of the device; and
  a silicon layer, a silicon dioxide layer and a high-k film on the nanowires in the gate region.

12. The semiconductor device as recited in claim 11, wherein an area of the bottom of the stack of semiconducting layers making contact with the silicon substrate on either side of the first trench comprise the site for the source region and the site for the drain region.

13. The semiconductor device as recited in claim 12, wherein a thickness of the oxide layer in the first trench is at least an order of magnitude greater than a thickness of a silicon dioxide layer formed on the nanowires.

14. The semiconductor device as recited in claim 12, further comprising:
  a silicon dioxide layer on the silicon substrate in the first trench; and
  a nitride layer on the silicon dioxide layer in the first trench, wherein the nitride layer is between the oxide layer and the silicon dioxide layer in the first trench.

15. The semiconductor device as recited in claim 12, wherein the oxide layer comprises rare earth metal oxide.

16. The semiconductor device as recited in claim 12, wherein the oxide layer comprises silicon dioxide, and wherein the stack is bonded on top of both the oxide layer and silicon on either side of the first trench.

17. The semiconductor device as recited in claim 12, further comprising a second trench in the oxide layer within the channel length filled with gate metal.

18. The semiconductor device as recited in claim 12, wherein the first type of semiconducting layer comprises one of silicon and silicon germanium.

19. A non-transitory computer readable storage medium storing program instructions, wherein the program instructions are executable by a processor to perform a semiconductor process that comprises:
  etching a first trench in a silicon substrate, wherein a length of the first trench is at least a channel length of the device and is bounded by a site for a source region and a site for a drain region;
  forming at least an oxide layer on top of the first trench;
  placing a stack of semiconducting layers on top of both the oxide layer and silicon substrate, wherein the stack comprises a plurality of semiconducting layers that alternate between at least two types of semiconducting layers and a bottom of the stack makes contact with the silicon substrate on either side of the first trench;
  creating a fin pattern from the stack;
  removing a portion of semiconducting layers of any type other than a first type from the stack, wherein the portion has a length approximately equal to that of the channel length, and wherein semiconducting layers of the first type form nanowires in a gate region of the device; and
  forming a silicon layer, a silicon dioxide layer and a high-k film on the nanowires in the gate region.

20. The non-transitory computer readable storage medium as recited in claim 19, wherein the program instructions are executable by a processor to perform the semiconductor process that further comprises forming the oxide layer in the first trench with a thickness at least an order of magnitude greater than a thickness of the silicon dioxide layer formed on the nanowires.

* * * * *